United States Patent [19]

Shreve

[11] Patent Number: 5,642,253

[45] Date of Patent: Jun. 24, 1997

[54] MULTI-CHANNEL IGNITION COIL DRIVER MODULE

[75] Inventor: John Robert Shreve, Kokomo, Ind.

[73] Assignee: Delco Electronics Corporation, Kokomo, Ind.

[21] Appl. No.: 509,380

[22] Filed: Jul. 31, 1995

[51] Int. Cl.$^6$ .................................................. H01H 47/28
[52] U.S. Cl. .......................... 361/152; 361/249; 361/263
[58] Field of Search ........................................ 361/247, 249, 361/254, 253, 263, 152; 307/38; 315/209–210

[56] References Cited

U.S. PATENT DOCUMENTS

| | | | |
|---|---|---|---|
| 4,475,280 | 10/1984 | Ragonese et al. | 29/577 |
| 4,929,884 | 5/1990 | Bird et al. | 323/313 |
| 4,961,006 | 10/1990 | Pace et al. | 307/270 |
| 5,164,875 | 11/1992 | Haun et al. | 361/64 |
| 5,396,117 | 3/1995 | Housen et al. | 327/480 |
| 5,397,964 | 3/1995 | Edwards | 315/209 |
| 5,424,665 | 6/1995 | Sueri et al. | 327/108 |

Primary Examiner—Jeffrey A. Gaffin
Assistant Examiner—Michael Sherry
Attorney, Agent, or Firm—Jimmy L. Funke

[57] ABSTRACT

The multi-channel ignition coil driver module of the present invention includes a control integrated circuit and multiple high current load driver integrated circuits housed within a common package. The control integrated circuit is formed of a semiconductor material manufactured in accordance with a standard low-voltage integrated circuit processing technology and is responsive to multiple control signal inputs to provide a corresponding multiple number of low voltage drive signals. Each of the high current load driver integrated circuits are formed of a semiconductor material manufactured in accordance with a high-voltage integrated circuit processing technology and are each responsive to a different one of the low voltage drive signals to energize a different one of a multiple number of high current loads. A current limit function is further provided in each of the multiple channels for limiting the corresponding load current to a predetermined level.

33 Claims, 7 Drawing Sheets

MULTI-CHANNEL IGNITION COIL DRIVER MODULE

FIELD OF THE INVENTION

The present invention relates generally to circuitry for driving an ignition coil of an electronic ignition system, and more specifically to such circuitry for driving multiple ignition coils wherein the circuitry is composed entirely of semiconductor material arranged as integrated circuitry.

BACKGROUND OF THE INVENTION

In the past few decades, the automotive industry has striven to expand both the number and types of vehicular functions and systems subject to computer control. Due in part to the proliferation of such computer control, however, available physical space within a vehicle has correspondingly diminished, thereby resulting in a demand for more compact control systems. At the same time, owing both to the competitive climate within the industry and to the crucial nature of some of the vehicular functions under computer control, the overall reliability of such control systems has risen to the level of paramount importance.

As an example of one such system subject to computer control, a modern automotive ignition system typically includes an ignition coil and a coil current switching device responsive to an ignition, or "drive", signal to energize the ignition coil. Some type of control circuitry, responsive to microprocessor control, provides a drive signal to the coil current switching device to thereby energize the primary side of the ignition coil.

Typical prior art automotive ignition systems have incorporated the control circuitry and coil current switching device into a single ignition module using a so-called hybrid electronics technology. Essentially, hybrid electronics is an amalgamation of integrated circuit technology and discrete electronic component technology arranged and surface mounted on a ceramic substrate.

Hybrid ignition modules have been well received in the automotive industry, but they suffer from several inherent drawbacks. First, due simply to the number and size of discrete and integrated components required for operation, the overall size of an ignition module can be quite large as compared to typical packaged integrated circuits. This problem is compounded by limitations inherent in hybrid processing technology, such as large conductor line widths and conductor routing limitations. The size and number of componentry further adds to the overall weight of the module which, as the number of such vehicular control systems increases, can become a significant factor in system design. Second, such hybrid modules are typically expensive to produce, particularly when compared to processing costs associated with comparably complex integrated circuits. Finally, because of the number of module components and interconnections therebetween, module reliability can be significantly less than that of comparably complex integrated circuits.

Designers of automotive ignition modules have attempted to address the foregoing drawbacks inherent in hybrid technology by designing so-called "single chip" ignition coil control circuits. Such circuits incorporate the control circuitry and coil driver device into a single high voltage integrated circuit, typically formed of silicon. Although typical single chip approaches address many of the drawbacks associated with hybrid ignition modules, they have their own inherent drawbacks to consider.

First, any single chip circuit incorporating a coil driver device therein must necessarily utilize a very high voltage semiconductor process for the control circuitry as well as the coil driver device. As such, this constitutes wasteful utilization of advanced semiconductor processing techniques since ignition control circuitry can generally be more cost effectively implemented with conventional integrated circuit processes.

Second, most single chip approaches provide the coil driver device in the form of a power transistor requiring drive currents on the order of 100 milliamperes. Since most automotive computer-controlled systems operate from low current regulated power supplies, the drive current demands of such single chip devices may require either more robust or supplemental power supplies for successful operation. In either case, most of the prior art single chip ignition coil control circuits further require some type of discrete componentry to limit power, supply current.

Third, prior art single chip ignition coil control circuits are somewhat limited in their range of application. Since different ignition systems incorporate different ignition coils, a wide variety of coil current requirements result therefrom. Single chip ignition coil control circuits must thus undergo expensive re-design and re-layout for each substantially higher or lower current capability version.

Finally, most prior art single chip ignition control circuits incorporate a bipolar junction power transistor as the coil driver device. Such a coil driver device is susceptible to becoming biased under a reverse battery condition so as to provide a high current flow back through the power transistor and the ignition coil, thereby resulting in potential damage to each. Such bipolar junction power transistors are further susceptible to a condition known as thermal "runaway", which occurs during high temperature and/or high power operating conditions. Essentially, thermal runaway may occur in a bipolar junction transistor because the collector current in such a device increases with increased junction temperature. This phenomena becomes a concern when driving inductive loads such that power dissipation increases with increased collector current, thereby resulting in further increased junction temperatures. This effect can become cumulative if proper corrective actions are not taken, such as through proper heat sinking and robust transistor design, eventually resulting in destruction of the transistor.

What is therefore needed is an ignition coil driver arrangement that overcomes the foregoing undesirable characteristics associated with both of the prior art approaches. Such an ignition coil driver arrangement should be easily and inexpensively produced to form an advantageously compact device. Ideally, such an ignition coil driver arrangement should include multiple channels for driving corresponding ignition coils in a multi-coil ignition control system. Such a multi-channel ignition coil driver module could be even more cost-effectively manufactured than a single channel ignition coil driver if the control circuitry is designed so that much of the circuitry is shared among the multiple channels.

SUMMARY OF THE INVENTION

The forgoing shortcomings of the prior art are addressed by the present invention. According to one aspect of the present invention, a module for driving multiple high current loads comprises a control circuit responsive to a plurality of low voltage control signals to provide a corresponding plurality of low voltage drive signals, wherein the control circuit is formed of a low voltage semiconductor material arranged as an integrated circuit. A plurality of high current load driver circuits, each arranged as an independent integrated circuit formed of a high voltage semiconductor material are included, wherein each of the high current load driver circuits are responsive to a different one of the plurality of low voltage drive signals to energize a corresponding one of the multiple high current loads. Finally, the module includes a housing having the control integrated circuit and the plurality of high current load driver integrated circuits mounted therein. In accordance with another aspect of the present invention, a module for driving multiple high current loads comprises a low voltage control integrated circuit including power supply and drive circuitry, wherein the power supply circuitry is responsive to any of a plurality of low voltage control signals to provide electrical power to the drive circuitry, and wherein the drive circuitry is responsive to the electrical power provided by the power supply circuitry and to the plurality of low voltage control signals to provide corresponding plurality of low voltage drive signals. A plurality of high current driver integrated circuits are included wherein each are responsive to a different one of the plurality of low voltage drive signals to energize a corresponding one of the multiple high current loads. Finally, the module includes a housing having the low voltage control integrated circuit and the plurality of high current driver integrated circuits mounted therein.

In accordance with a further aspect of the present invention, an ignition control system comprises a control module providing a plurality of ignition coil control signals, a corresponding plurality of ignition coils each having a primary ignition coil connected at a first end to a source of electrical power, and an ignition coil driver module having a corresponding plurality of inputs and outputs. Each of the inputs receive a different one of the plurality of ignition coil control signals, and each of the outputs are connected to a second end of a different one of the plurality of primary ignition coils, wherein the ignition coil driver module is independently responsive to any of the ignition coil control signals to energize a corresponding one of the primary coils.

One object of the present invention is to provide multi-channel ignition coil driver circuitry mounted within a common housing.

Another object of the present invention is to provide a multiple chip ignition coil driver module wherein a control integrated circuit provides multiple low voltage drive signals and is manufactured according to a standard low-voltage integrated circuit process technology, and a corresponding multiple number of high current drive integrated circuits manufactured according to a high-voltage integrated circuit process technology are each responsive to a different one of the multiple low voltage drive signals to energize a corresponding number of multiple ignition coils.

A further object of the present invention is to provide a multi-channel ignition coil driver module which can be activated and powered directly from one of a corresponding multiple number of externally generated control signals.

These and other objects of the present invention will become more apparent from the following description of the preferred embodiment.

DESCRIPTION OF THE PREFERRED EMBODIMENT

Figure 1:
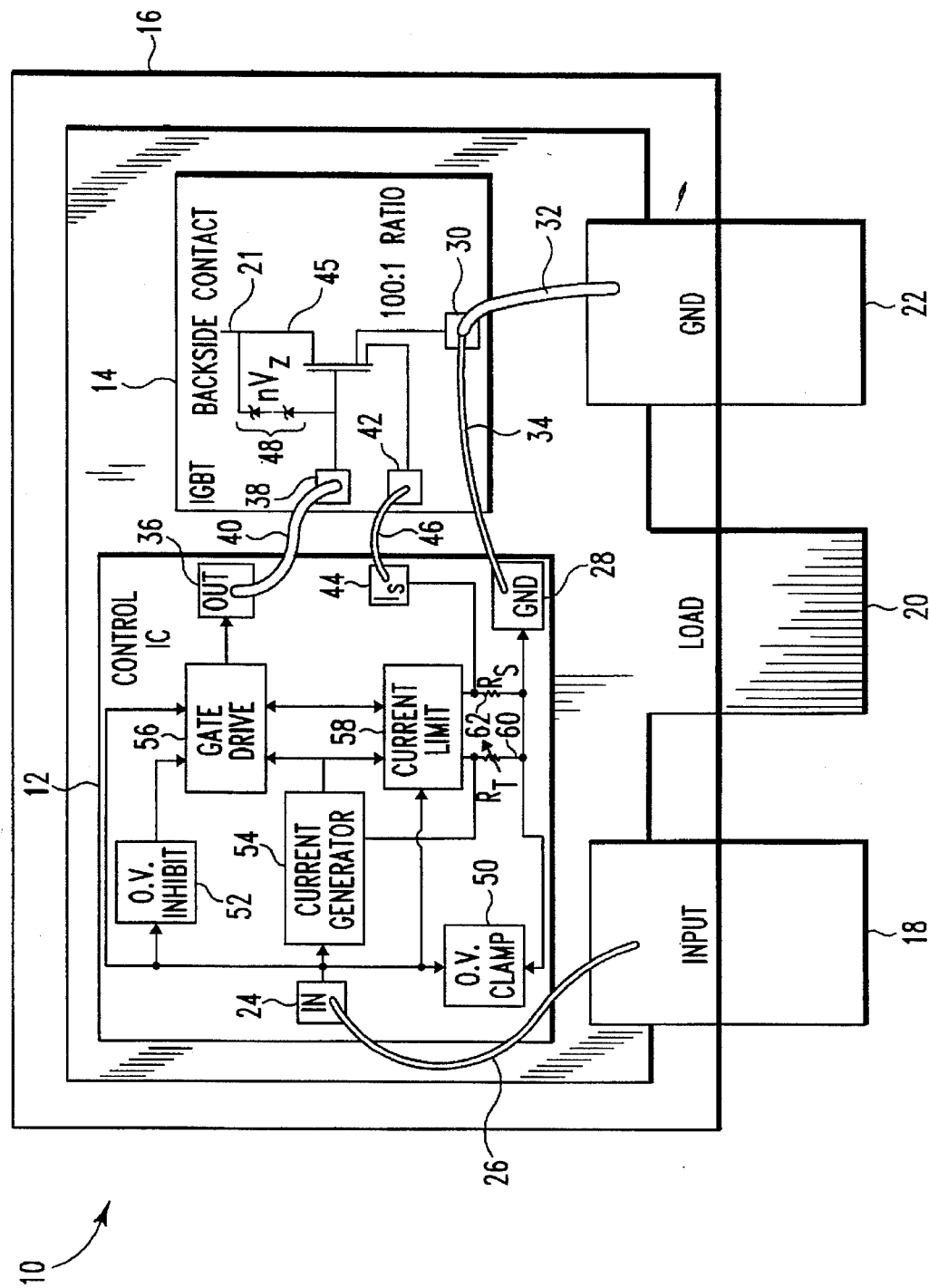
FIG. 1 is a schematic diagram of a single channel ignition coil driver module in accordance with the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to FIG. 1, a single channel ignition coil drive module 10, in accordance with the present invention, is shown. Ignition coil drive module 10 includes a control integrated circuit 12 and a high current load drive integrated circuit 14 mounted within a housing 16. Housing 16 may include a number of electrically conducting terminals extending therein to provide electrical connection to either of the circuits 12 and 14. In a preferred embodiment, as shown in FIG. 1, housing 16 includes three such electrical terminals.

A first terminal 18 (INPUT) extends into housing 16 and is electrically connected to an input 24 (IN) of the control integrated circuit 12. Preferably, terminal 18 is connected to input 24 via a bond wire 26, as is commonly known within the integrated circuit industry, although the present invention contemplates other known techniques of making such an electrical connection such as via tape-automated-bonding (TAB) or solder bump attachment, for example.

A second terminal 20 (LOAD) extends into housing 16 and is electrically connected to a load current input 21 of the high current load drive circuit 14. Preferably, terminal 20 forms an integrated circuit mount for mounting integrated circuits 12 and 14 thereto. Further, the substrate of high current load drive integrated circuit 14 is preferably the load current input 21 thereto so that electrical connection between terminal 20 and load current input 21 may be made by mounting circuit 14 to terminal mount 20 via an electrically conducting attachment medium. Generally, the electrically conducting integrated circuit attachment medium serves two functions. First, it should be formed of a material that will maintain both a structural and electrical bond between circuit 14 and terminal 20 under high temperatures generated by the conduction of load current through the circuit 14. Second, it should be formed of a material having high thermal conductivity so that heat generated by the conduction of load current through circuit 14 may be effectively passed to terminal 20, which also acts as a heat sink for the module 10. Preferably, the electrically conducting attachment medium is an integrated circuit mounting solder, as is commonly known in the integrated circuit industry, although the present invention contemplates using other known electrically conducting attachment media. An example of one such medium is electrically conductive epoxy, although it is to be understood that such an epoxy generally has a higher thermal resistance than solder and may therefore only be reliably used in low load current/low power applications.

A third terminal 22 (GND) extends into housing 16 and is electrically connected to ground references 28 and 30 of control integrated circuit 12 and high current drive integrated circuit 14 respectively. Preferably, terminal 22 is connected to ground reference 30 via a bond wire 32 or equivalent connection as previously discussed, and ground reference 30 is connected to ground reference 28 via a bond wire 34 (or equivalent structure). However, the present invention contemplates that bond wire 32 may alternatively be connected to ground reference 28, or that both bond wires 32 and 34 may be connected to terminal 22 at one end, with the opposite end of each bond wire connecting to the respective ground reference 28 or 30. As is common in the integrated circuit industry, the substrate of control integrated circuit 12 is preferably connected to ground reference 28. Thus, attachment of control integrated circuit 12 to terminal 20 must be made via an electrically insulating medium to avoid shorting the load current input 21 of the high current load drive integrated circuit 14 to ground potential. Preferably, the electrically insulating attachment medium is an electrically non-conductive epoxy, although the present invention contemplates using other known electrically insulating adhesives as the attachment medium. Alternatively, a layer of electrically insulating material may be deposited or otherwise attached to a portion of terminal 20 under integrated circuit 12. Integrated circuit 12 may then be attached to the electrically insulating material via any type of epoxy or other known attachment media. The layer of electrically insulating material may be formed of $SiO_2$ (glass), silicon nitride, polyimide, or any other electrically insulating material commonly used in the semiconductor industry.

Housing 16 is preferably formed of an integrated circuit encapsulant commonly known in the integrated circuit industry. In its final form, the ignition coil driver module 10 is provided as a three-pin integrated circuit package, preferably having either a TO-247 or TO-264 package configuration. However, the present invention contemplates providing ignition coil driver module 10 in any of a variety of known package configurations, or in a custom package configuration, an important advantage of module 10 being a significant size and weight reduction over prior art hybrid-type ignition modules.

In addition to input IN 24, control integrated circuit 12 further includes an output 36 (OUT) for providing a "drive" signal to a corresponding input 38 of high current load drive integrated circuit 14. Further, high current load drive integrated circuit 14 includes an output 42 for feeding back a portion of the load current to an input 44 ($I_s$) of control integrated circuit 12. OUT 36 is connected to input 38, and output 42 is connected to $I_s$ 44, preferably by bond wires 40 and 46 respectively, although the present invention contemplates alternative arrangements for providing electrical connections therebetween as previously discussed.

An important advantage of the present invention is the partitioning of the ignition coil drive functions into a control integrated circuit 12 and a high current load drive integrated circuit 14. All functions typically considered to be "control" functions, examples of which will be provided hereinafter, are incorporated into the control integrated circuit 12, and the high current load drive integrated circuit 14 provides the necessary drive capability to energize the load. In a typical application of module 10, the load is a primary coil of an automotive ignition coil, which generally has high voltages and load currents associated therewith. Since voltages within the 400–600 volt range, and load currents within the 500 milliampere to 20 ampere range, are typically encountered in normal operation of the primary of an automotive ignition coil, integrated circuit 14, preferably formed of silicon, must be manufactured using a high voltage semiconductor process capable of operating at voltages in excess of 600 as volts. The control integrated circuit 12, on the other hand, need only operate at low voltages to provide control functions internal to circuit 12 and to provide a sufficient drive signal to circuit 14. Typical voltage levels associated with control integrated circuit 12 operation may range from between approximately 3.0 volts to approximately 24 volts. Integrated circuit 12, also preferably formed of silicon, may therefore be manufactured using a standard (and comparatively inexpensive) low voltage process typically operating at voltages of less than 24 volts. One such common low voltage bipolar integrated circuit process is capable of withstanding, without damage thereto, voltages up to the 40–60 volt range. Thus, the integrated circuit partitioning approach of the present invention, as illustrated with the ignition coil driver module 10 of FIG. 1, offers the size and weight advantages (as well as other advantages discussed hereinafter) that prior art "single chip" ignition coil drive circuits enjoy over similar hybrid-type approaches, while further offering the advantage of providing much of the module 10 circuitry, namely control circuit 12, with a low cost and commonly used low voltage integrated circuit process technology.

High current load driver integrated circuit 14 includes a power transistor 45 as its central component. Transistor 45 has a drive input 38 which is responsive to a drive signal to provide a load current conduction path between load current input 21 and output 30 (typically ground referenced). In FIG. 1, transistor 45 also includes a second output 42 which provides a portion of the load current thereat, as will be more fully discussed hereinafter. Transistor 45, as previously indicated, must be capable of operating at load currents of between approximately 500 milliamperes and 20 amperes. Although the load may typically be the primary coil of an automotive ignition coil, the present invention contemplates utilizing the integrated circuit partitioning approach disclosed herein to provide load drive capability to a wide variety of such high current loads. As one example of such a high current load, fuel injectors for internal combustion engines are typically inductive loads requiring load currents in the range of approximately 500 milliamperes to approximately 10 amperes. Other such high load current uses for the integrated circuit partitioning approach of the present invention will become apparent to those skilled in the integrated circuit and electronic system design arts.

A phenomena known as "inductive flyback" is known to occur when driving inductive loads with a circuit configuration of the type shown in FIG. 1. Essentially, this phenomena occurs when a high current has been established at transistor input 21, and the drive signal to the input 38 of transistor 45 is thereafter removed. The subsequent inductive "flyback" effect creates a high voltage at input 21 which may exceed the breakdown voltage of the transistor 45 junctions located between input 21 and output 30. The combination of this high voltage and full load current creates a potentially destructive condition for transistor 45. To guard against such potential damage, it is known to provide a series, or stack, of n zener diodes 48 between inputs 21 and 38 of transistor 45. The number n is chosen so that the aggregate breakdown (avalanche) voltage of the zener diode stack 48 is less than the minimum avalanche breakdown voltage of the transistor 45 junctions located between input 21 and output 30. In operation, if the high voltage at input 21 created by the "flyback" effect exceeds the zener diode stack 48 aggregate breakdown voltage, current flows through stack 48, thereby turning transistor 45 back on. In this manner, the voltage at input 21 of transistor 45 is actively clamped at a maximum voltage approximately equal to the aggregate breakdown voltage of zener diode stack 48.

Preferably, power transistor 45 is a known metal-oxide-semiconductor field effect transistor (MOSFET) variant known in the semiconductor industry as an insulated gate bipolar transistor (IGBT). IGBT 45 may be turned on to full conduction with the application of a small current at its gate (input 38) to charge its gate capacitance to approximately 2–4 volts. Typically, this small input current is within the range of between approximately 200 micro amperes to approximately 3.0 milliamperes.

Apart from the low current drive requirements of IGBT 45, another advantage of using such a device lies in its inherent reverse voltage blocking capability. With a darlington-connected bipolar junction power transistor (BJT) pair commonly used as a power output device in prior art ignition coil driver systems, a normally reverse-biased parasitic body diode exists across the collector-emitter of the transistor pair. This parasitic diode is inherent in the construction of such a darlington-connected bipolar transistor pair. Thus, if the battery, typically connected between the ignition coil primary and ground, is connected with reverse polarity, the parasitic body diode becomes forward biased, thereby conducting potentially high current back through the ignition coil primary. IGBT 45, by contrast, has no such parasitic body diode so that the reverse breakdown voltage between output 30 and input 21 is much higher than typical battery voltages, thereby blocking potentially high current flow through the coil primary under a reverse battery condition.

A further advantage of using IGBT 45 is that this type of device is not susceptible to the same type of thermal runaway characteristics previously discussed with respect to BJTs. As a result, IGBT 45 offers more robust and reliable operation during high temperature/high current operating conditions than prior art ignition coil driver circuits using BJTs as the power output device.

Although an IGBT is a preferred embodiment of power output transistor 45, particularly in view of foregoing advantages associated therewith, the present invention further contemplates using other known power transistors as transistor 45 such as, for example, a power BJT or a power MOSFET. Although such power output devices may not provide optimal operating characteristics for ignition coil drive module 10, other considerations may require their use. Moreover, other applications of the integrated circuit partitioning concepts of the present invention may require, in some circumstances, use of such other power output devices. It is to be understood that the use of such power output devices in any such system employing the integrated circuit partitioning concepts disclosed herein is intended to fall within the scope and spirit of the present invention.

Power transistor 45 further includes an output leg 42 extending therefrom. Typically, output leg 42 of IGBT 45 is set up to provide a sense current which is a 100:1 ratio of the load current flowing from input 21 to ground 30. If the load current flowing from input 21 to ground 30 is equal to 6 amperes, the current flowing through output leg 42 will therefore be approximately 60 milliamperes, thus resulting in a total load current through IGBT 45 of approximately 6.06 amperes. If power transistor 45 is a typical BJT, the 100:1 ratioing may be accomplished through appropriate ratioing of emitter areas, as is known in the art of integrated circuit design. IF power transistor 45 is a MOSFET or IGBT, the 100:1 ratioing may be accomplished by isolating an appropriately sized portion of the transistor source diffusion, and providing the isolated portion as source leg 42. A more detailed explanation of the 100:1 ratioing with an IGBT is given in related U.S. patent application Ser. No. 08/508,402, entitled IGNITION COIL DRIVER MODULE INCLUDING COIL CURRENT LIMITING FEATURE, filed by John R. Shreve et al., and assigned to the assignee of the present invention. Those skilled in the art will recognize that any desired sense current to load current ratio may be provided through appropriate sizing of the BJT emitter areas or source diffusion isolation.

Turning now to control integrated circuit 12, the functional blocks shown therein will now be described in detail. It should first be pointed out that IN 24 is connected to every functional block shown within the borders of integrated circuit 12, and that no power supply input to circuit 12 exists. Since the control integrated circuit 12 may be manufactured from a low voltage semiconductor process as previously indicated, and since IGBT 45 has low input current requirements, the entire control circuit 12 does not require much current to operate. Typically the total current required by control integrated circuit 12 is between approximately 2–3 milliamperes. As such, a power supply connection to the circuit 12 is not required and all circuitry on the control integrated circuit 12 is simultaneously powered and activated through a control signal at input IN 24. In other words, a control signal at input IN 24 instructs module 10 to turn on and activate IGBT 45 for as long as the control signal is present.

Input IN 24 is connected to an over-voltage clamp circuit 50 which clamps the control signal at input IN 24 at a clamp voltage of between approximately 32–40 volts to prevent damage to the control circuit 12. Over-voltage clamp circuit 50 essentially utilizes a stack of zener diodes in series with a known "$V_{be}$ multiplier" control transistor to establish the clamp voltage as is known in the integrated circuit design art. In implementing circuit 12 with a known low voltage bipolar semiconductor process, a stack of four such diodes are used, each having an avalanche breakdown voltage of between approximately 7–8 volts, in series with a $V_{be}$ multiplier (established by multiplying a base/emitter voltage drop of approximately 600–800 millivolts by a resistor ratio as is known in the art), thus resulting in a clamp voltage of between approximately 32–40 volts.

Input IN 24 is further connected to an over-voltage inhibit circuit 52 which is further connected to a gate drive circuit 56. Over-voltage inhibit circuit 52 monitors the control signal at input IN 24 and inhibits operation of the gate drive circuitry 56 if the voltage at input IN 24 exceeds a normal battery voltage level. Typically, a battery voltage of above approximately 24 volts is considered to exceed a normal battery voltage level. Over-voltage inhibit circuit 52, like over-voltage clamp circuit 50, essentially utilizes a stack of zener diodes in series with a $V_{be}$ multiplier to establish the over-voltage inhibit level as is known in the integrated circuit design art. Preferably, a stack of three such diodes are used in series with a $V_{be}$ multiplier, as previously described, to thereby establish an over-voltage inhibit level of between approximately 26.5–32.0 volts.

Input IN 24 is further connected to a current generator circuit 54 which is, in turn, connected to gate drive circuit 56, a current limit circuit 58 and a trimmable resistor $R_T$. Current generator circuit 54 contains a series of known "delta $V_{be}$" current sources which are responsive to the control signal at input IN 24 to supply reference currents to the foregoing circuits.

Input IN 24 is further connected to gate drive circuit 56 which operates under the direction of over-voltage inhibit circuit 52 and current generator circuit 54. If the control signal at input IN 24 is less than the over-voltage inhibit level of between approximately 26.5–32.0 volts, a reference current generated by current generator circuit 54 turns on the gate drive control circuit 56, thereby providing a coil drive signal at output OUT 36. Essentially, gate drive circuit 56 is an output stage having current sourcing and current sinking capability as is known in the integrated circuit design art. Gate drive circuit 56 preferably includes some type of known voltage clamp circuitry for clamping the output voltage between approximately 7–8 volts. In order to drive the gate 38 of IGBT 45, as previously discussed, output OUT 36 is capable of sourcing at least 3 milliamperes. Gate drive circuit 56 further includes circuitry responsive to the over-voltage inhibit circuit 52 such that if the control signal at input IN 24 exceeds the over-voltage inhibit level of between approximately 26.5–32.0 volts, the current source portion of gate drive circuit 56 is disabled.

Input IN 24 is further connected to current limit circuit 58 which is further connected to current generator circuitry 54, the current source circuitry of gate drive circuit 56 and resistors $R_T$ 60 and $R_S$ 62. Resistor $R_T$ 60 is a trimmable resistor such that the resistance of $R_T$ 60 may be increased by opening fusible links to thereby incrementally add series resistance to $R_T$ 60, as is known in the integrated circuit art, and is further connected to a reference current supplied by current generator 54 to provide a fixed reference voltage across $R_T$ 60. Resistor $R_S$ 62 is a fixed resistor and is further connected to input $I_S$ 44.

In operation, current generator 54 is responsive to a control signal at input IN 24 to supply reference currents to the current limit circuitry 58 and resistor $R_T$ 60. The gate drive circuit 56 is further responsive to the control signal to provide a low-voltage (up to 7–8 volts) at output OUT 36, thereby driving the gate 38 of IGBT 45. As IGBT 45 begins to turn on, output leg 42 of IGBT 45 provides a sense current therethrough to resistor $R_S$ 62, which is preferably a 100:1 ratio of the load current. Essentially, the current limit circuit 58 is an error amplifier, and resistors $R_T$ 60 and $R_S$ 62 are connected to inputs thereof. As the sense current through $R_S$ 62 increases, the voltage drop across $R_S$ 62 increases. As the voltage drop across $R_S$ 62 approaches that of the reference voltage across $R_T$ 60, the error amplifier decreases the gate drive voltage at output OUT 36 of control circuit 12. Circuit equilibrium is reached when the voltage drop across $R_S$ 62 is approximately equal to the voltage drop across $R_T$ 60 (preferably between approximately 50–60 millivolts). Such an error amplifier is known in the integrated circuit design art and, in a preferred embodiment, $R_S$ 62 and $R_T$ 60 are chosen so that the gate drive output at OUT 36 begins to decrease when the load current rises to approximately 6 amperes. The current limit circuit 58 thereafter decreases the gate drive output at OUT 36, until circuit equilibrium is reached wherein the voltage drop across $R_S$ 62 is approximately 50–60 millivolts. A more detailed explanation of the operation of the foregoing current limit function is provided in related U.S. patent application Ser. No. 08/508,402 entitled IGNITION COIL DRIVER MODULE INCLUDING COIL CURRENT LIMITING FEATURE, filed by John R. Shreve et al., and assigned to the assignee of the present invention.

Figure 2:
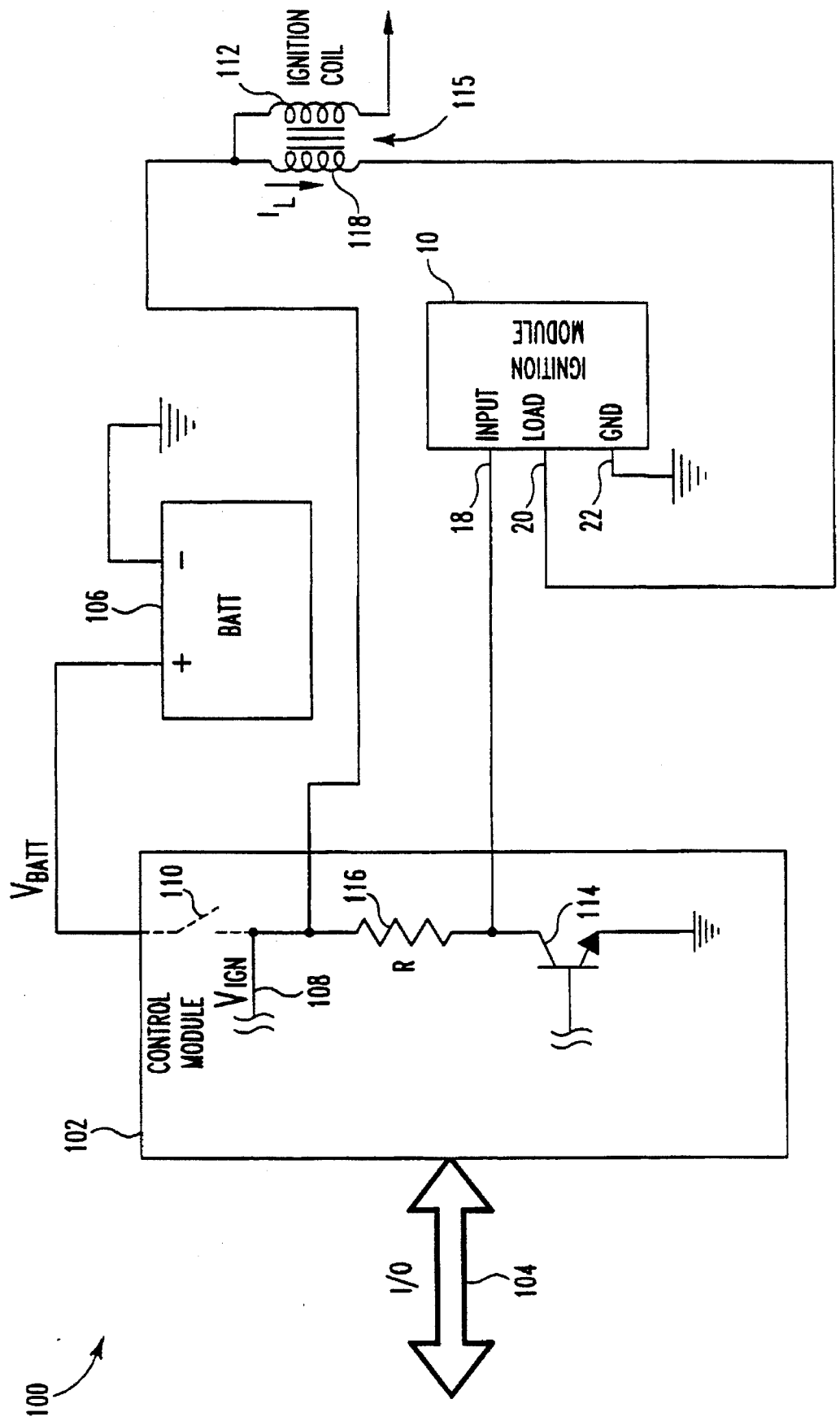
FIG. 2 is a schematic diagram showing a typical implementation of the ignition coil driver module of FIG. 1 in an ignition control system.

Referring now to FIG. 2, a typical ignition control system 100 is shown incorporating the ignition coil driver module 10 of FIG. 1. Central to ignition control system 100 is control module 102, sometimes referred to in the automotive industry as an electronic control module (ECM) or powertrain control module (PCM). By either name, control module 102 is a computer controlled module, typically under microprocessor control, and includes read-only-memory (ROM) and random-access-memory (RAM) for storing data and software algorithms executable by the microprocessor (not shown). Control module 102 includes a plurality of input and output (I/O) 104 connections for interfacing with various operational and diagnostic signals.

Control module 102 is powered by battery 106 which provides a battery voltage $V_{BATT}$ of between approximately 7.0 volts and 24 volts, with typical $V_{BATT}$ voltages being in the range of approximately 12–16 volts.

As shown in FIG. 2, battery voltage $V_{BATT}$ is connected to a switch 110 which is, in turn, connected to a signal line labeled VIGN 108. Although shown as a physical switch within control module 102, switch 110 preferably represents a portion of a vehicle ignition switch operable via an ignition key. Ignition key switch (not shown) typically has an "off" position, an "on" position and a "crank" position. When the ignition key switch is switched from the "off" position to either the "crank" position or the "on" position (hereinafter referred to as an "ignition signal"), switch 110 connects the voltage $V_{BATT}$ to the VIGN 108 line. VIGN line 108 is connected to one end of the primary 118 and secondary 112 coils of the ignition coil 115, and to one end of a pull-up resistor R 116. The other end of resistor R 116 is connected to the collector of transistor 114 and to INPUT 18 of ignition coil driver module 10. The emitter of transistor 114 is referenced at ground potential and the base of transistor 114 is driven by circuitry within control module 102. LOAD 20 of ignition coil driver module 10 is connected to the remaining end of the primary coil 118 of the ignition coil 115.

Figure 3:
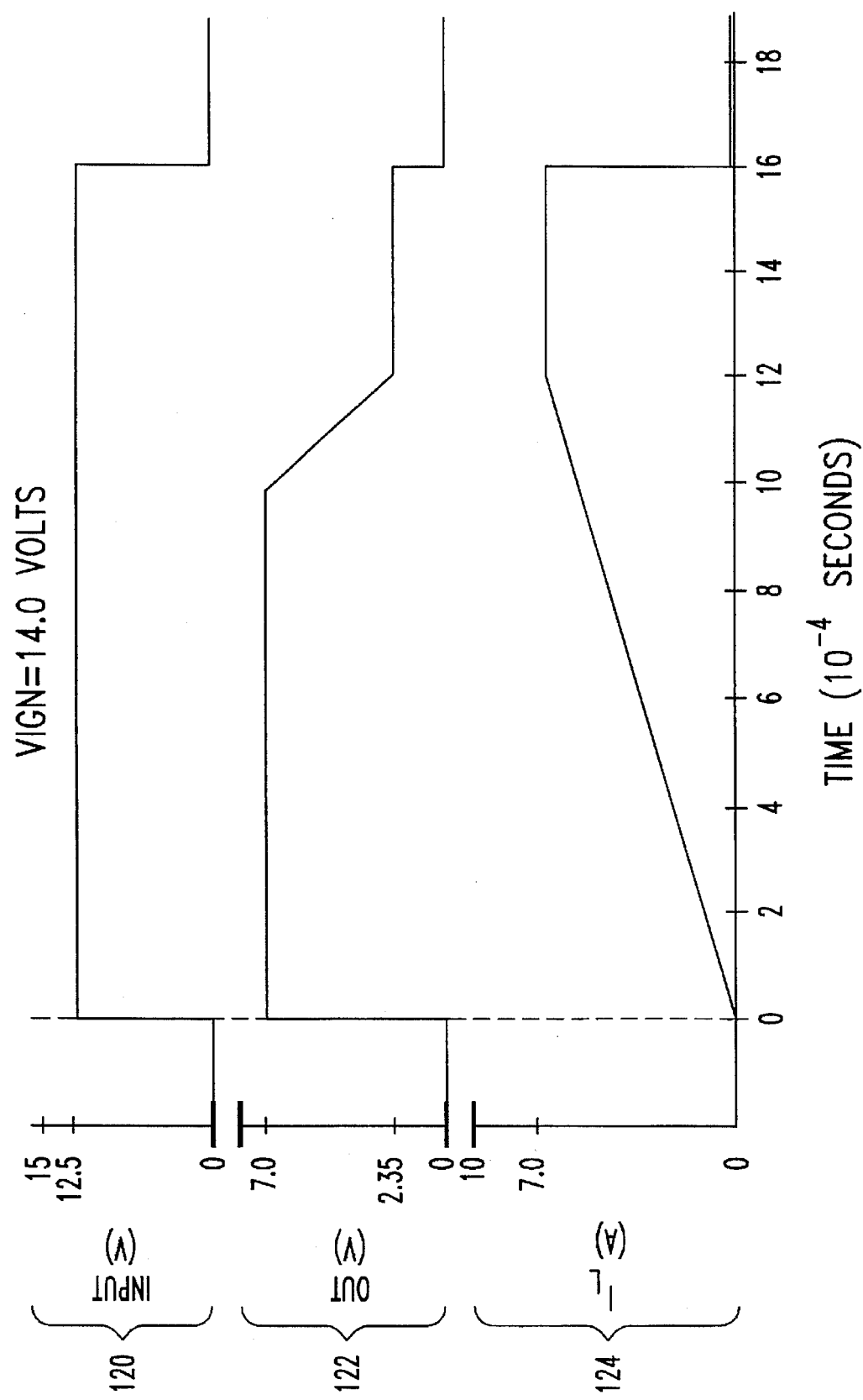
FIG. 3 is a waveform diagram showing typical operation of the ignition coil driver module of FIG. 1 in the ignition control system of FIG. 2.

Referring now to both FIG. 2 and FIG. 3, the operation of ignition coil driver module 10 within ignition control system 100 will now be described with a $V_{BATT}$ voltage of 14 volts. In response to an ignition signal received via switch 110, control module 102 connects battery voltage $V_{BATT}$ to VIGN 108. Control module 102 then receives vehicular operational and diagnostic data via I/O 104 and determines therefrom the appropriate spark advance and dwell time for optimal engine operation as is known in the automotive industry. Based upon the determination of spark advance, dwell time and other factors such as $V_{BATT}$ level, for example, control module 102 provides a predetermined duration low drive signal to normally on transistor 114, which causes INPUT 18 of ignition coil driver module 10 to be connected to VIGN 108 through resistor R 116. Ignition control driver module 10 has been designed to draw an operating current of between approximately 2–3 milliamperes at INPUT 18, so that resistor R 116 is chosen to be approximately 500 ohms.

With $V_{BATT}$, and hence VIGN, equal to 14 volts, and taking into account the voltage drop across R116 due to the 2–3 milliampere operating current, the voltage 120 (FIG. 3) at INPUT 18 rises to approximately 12.5 volts in response to the low drive signal impressed upon transistor 114 by control module 102. Upon receiving 12.5 volts at INPUT 18, the current generator 54 and gate drive 56 circuits are energized. Since the voltage at INPUT 18 is less than the over-voltage inhibit voltage of over-voltage inhibit circuit 52, but greater than the clamp voltage of the output circuitry of gate drive circuit 56, the voltage 122 (FIG. 3) at OUT 36 of control integrated circuit 12 rises immediately to the clamp voltage of approximately 7 volts.

A voltage of approximately 7 volts at OUT 36 turns on IGBT 45 to full conduction so that a load current $I_L$ 124 (FIG. 3) begins to increase through the primary coil 118 of the ignition coil 115. A 100:1 ratio of the load current $I_L$ is fed back as a sense current $I_S$ to the current limit circuit 58 of control integrated circuit 12 via IGBT leg 42. When the load current $I_L$ increases to approximately 6 amperes (corresponding to a sense current $I_S$ of approximately 60 milliamperes), the current limit circuit 58 begins to pull current out of the output circuitry of the gate drive circuit 56 as previously discussed, thereby decreasing the IGBT drive voltage at OUT 36 of control integrated circuit 12. Equilibrium within current limit circuit 58 is reached when the load current $I_L$ 124 reaches approximately 7 amperes, corresponding to a voltage at OUT 36 of approximately 2.35 volts. Load as current $I_L$ 124 is thereafter maintained at a constant 7 ampere level for the duration of the low drive signal impressed upon transistor 114 by control module 102. When transistor 114 is turned back on, the various circuits within control integrated circuit 12 are returned to their de-energized state, thereby turning off the drive voltage 122 to the gate 38 of IGBT 45.

Several advantages of the ignition coil driver module 10 of the present invention over both the prior art hybrid and single integrated circuit ignition coil driving approaches have been described herein. Another important advantage of this dual integrated circuit concept over the single integrated circuit approach in particular lies its inherent ability to adapt to changing requirements. Specifically, the two-chip partitioning described herein permits the load drive integrated circuit 14 to be exchanged for larger or smaller current capability devices without changing the design, layout or tooling of the control integrated circuit 12. This represents both a time and cost savings advantage where multiple applications requiring different load currents are required.

Figure 4:
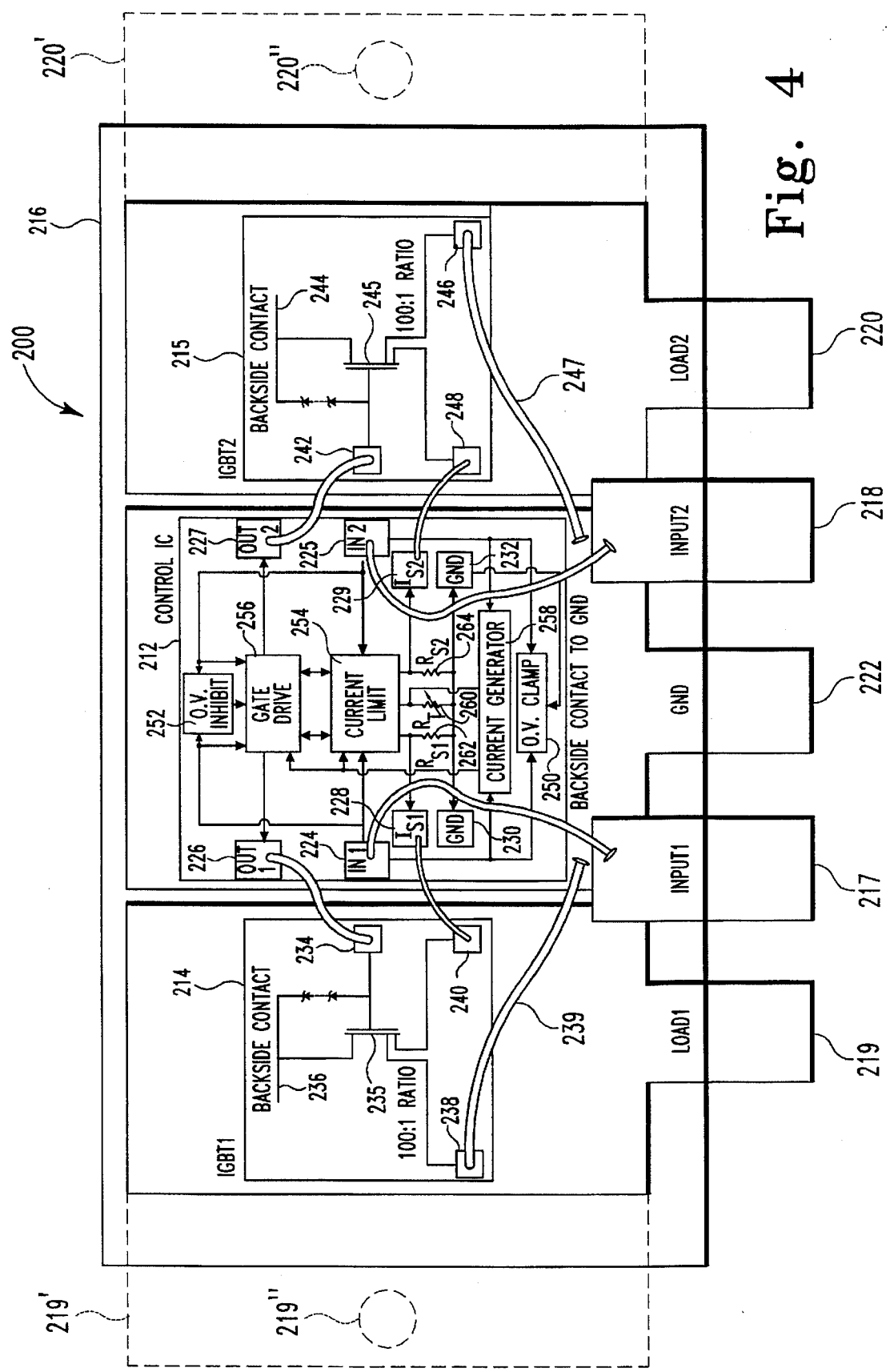
FIG. 4 is a schematic diagram of one embodiment of a multi-channel ignition coil driver module in accordance with the present invention.

Referring now to FIG. 4, a two-channel ignition coil driver module 200, in accordance with one embodiment of the present invention, is shown. However, it is to be understood that the concepts underlying the any of the two-channel approaches described may be easily extended to any number of multiple channels to thereby construct a multi-channel ignition coil driver module. Module 200 includes a control integrated circuit 212, similar in many respects to control integrated circuit 12 of module 10, and a pair of high current load drive integrated circuits 214 and 215, preferably identical to high current load drive integrated circuit 45 of module 10, mounted within a housing 216. Housing 216 may include a number of electrically conducting terminals extending therein to provide electrical connection to any of the circuits 212, 214 and 215. In a preferred embodiment, as shown in FIG. 4, housing 216 includes five such electrical terminals.

A first terminal 217 (INPUT1) extends into housing 216 and is electrically connected to an input 224 (IN1) of the control integrated circuit 212. Preferably, terminal 217 is connected to input 224 via a bond wire, although other known techniques of making such an electrical connection are contemplated by the present invention as previously discussed.

A second terminal 218 (INPUT2) extends into housing 216 and is electrically connected to an input 225 (IN2) of the control integrated circuit 212. As with terminal 217, terminal 218 is preferably connected to input 225 via a bond wire, although other known techniques of making s such an electrical connection are contemplated by the present invention as previously discussed.

A third terminal 219 (LOAD1) extends into housing 216 and is electrically connected to a load current input 236 of the high current load drive circuit 214. Preferably, terminal 219 forms an integrated circuit mount for mounting integrated circuit 214 thereto. Further, the substrate of high current load drive integrated circuit 214 is preferably the load current input 236 thereto so that electrical connection between terminal 219 and load current input 236 may be made by mounting circuit 214 to terminal mount 219 via an electrically conducting attachment medium as is previously discussed with respect to the mounting of circuit 14 to terminal mount 20 as shown in FIG. 1.

A fourth terminal 220 (LOAD2) extends into housing 216 and is electrically connected to a load current input 244 of the high current load drive circuit 215. As with terminal 219, terminal 220 preferably forms an integrated circuit mount for mounting integrated circuit 215 thereto. Further, the substrate of high current load drive integrated circuit 215 is preferably the load current input 244 thereto so that electrical connection between terminal 220 and load current input 244 may be made by mounting circuit 215 to terminal mount 220 via an electrically conducting attachment medium as previously described.

A fifth terminal 222 (GND) extends into housing 216 and is electrically connected to ground references 230 and 232 of control integrated circuit 212. Outputs 238 and 246 of high current drive integrated circuits 214 and 215 respectively are also connected to GND terminal 222, preferably via bond wires 239 and 247, respectively. Ground references 230 and 232 are preferably connected to the substrate of control integrated circuit 212 using known integrated circuit processing techniques. Further, GND terminal 222 preferably forms an integrated circuit mount so that the two ground references 230 and 232 are electrically connected to terminal 222 via attachment of the substrate of control integrated circuit 212 to terminal mount 222. Since control integrated circuit is preferably a low voltage integrated circuit, it does not generate much heat during operation thereof. As such, control integrated circuit 212 may be attached to terminal mount via any known electrically conductive attachment medium such as conductive epoxy or solder, for example. Housing 216 is preferably formed of an integrated circuit encapsulant commonly known in the integrated circuit industry. In its final form, the two-channel ignition coil driver module 200, is provided as a five-pin integrated circuit package, preferably having a TO-220 or similar package configuration. However, the present invention contemplates providing ignition coil driver module 10 in any of a variety of known package configurations, or in a custom package configuration. For example, terminals 219 and 220 may further include tab-like projections 219' and 220' extending respectively therefrom as shown in phantom. Projections 219' and 220' may further include a hole 219" and 220" respectively for receiving a screw or other fastener therethrough so that projections 219' and 220' may be secured to another structure such as an external heat sink (not shown), for example. Alternatively, projections 219' and 220' may serve as the LOAD1 and LOAD2 electrical connections to load current input 236 and load current input 244 respectively so that electrical connection terminals 219 and 220 need not extend outwardly from within the housing 216. As such, module 200 may be provided as a "TO-247 like" or "TO-264-like" package configuration.

In addition to inputs IN1 224 and IN2 225, control integrated circuit 212 further includes an output 226 (OUT1) for providing a "drive" signal, corresponding to a control signal received at input IN1 224, to a corresponding input 234 of high current load drive integrated circuit 214. Similarly, control integrated circuit 212 includes an output 227 (OUT2) for providing a "drive" signal, corresponding to a control signal received at input IN2 225, to a corresponding input 242 of high current load drive integrated circuit 215.

High current load drive integrated circuits 214 and 215 are further identical to high current load drive integrated circuit 45 in that each further includes an output 240 and 248 respectively for feeding back a portion of the load current flowing therethrough to inputs 228 ($I_{S1}$) and 229 ($I_{S2}$) respectively of control integrated circuit 212. All electrical connections between integrated circuits are preferably made via bond wires as previously discussed with respect to module 10 of FIG. 1, although the present invention contemplates using any type of known electrical connection means as previously discussed.

An important advantage of the two-channel module 200 is the partitioning of all ignition coil drive functions into a single control integrated circuit 212 and a pair of high current load drive integrated circuits 214 and 215. In this way, circuitry within control integrated circuit 212 that is common to each channel may be shared to thereby reduce the required integrated circuit area and to further reduce current consumption by circuit 212.

For example, control integrated circuit 212 preferably includes the same functions as those described with respect to module 10 of FIG. 1. However, as shown in FIG. 4, the over-voltage inhibit circuit 252 receives inputs from both IN1 224 and IN2 225, and provides a single output to gate drive circuit 256. Over-voltage inhibit circuit 252 is thus responsive to either input to turn off the gate drive circuitry, as previously discussed, if the voltage at either IN1 224 or IN2 225 exceeds the over-voltage threshold value.

Over-voltage clamp circuitry is similarly responsive to the voltage at either IN1 224 or IN2 225 to clamp the respective voltage at the predetermined input clamp voltage. The current generator circuit 258 is similarly responsive to the voltage at either IN1 224 or IN2 225 to provide operating reference currents to the gate drive circuit 256 and current limit circuit 254 as previously discussed. The gate drive circuitry is similarly responsive to the voltage at either IN1 224 or IN2 225 to provide the corresponding low voltage drive signal at either OUT1 226 or OUT2 227 respectively, in the same manner as previously discussed.

Finally, current limit circuit 254 may include a single trimmable resistor $R_T$ 260, serving the same function as $R_T$ 60 of module 10, and a pair of sense resistors $R_{S1}$ 262 connected to $I_{S1}$ 228, and $R_{S2}$ 264 connected to $I_{S2}$ 229. In operation, current limit circuit 254 is responsive to either a sense current forced into $R_{S1}$ 262, or a sense current forced into $R_{S2}$ 264 to correspondingly reduce the level of the low level drive signal at OUT1 226 or OUT2 227 respectively in a manner as previously discussed.

Figure 5:
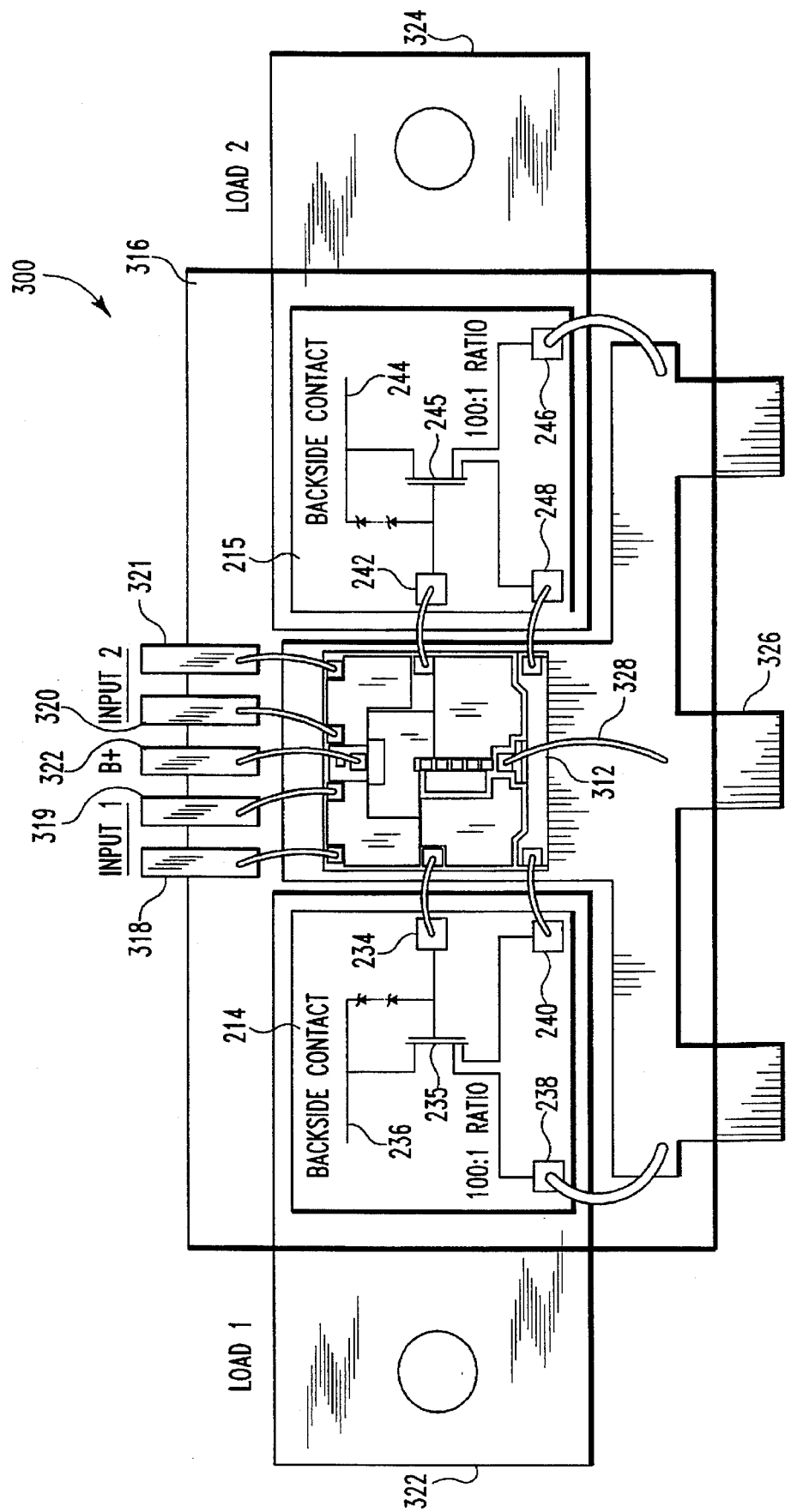
FIG. 5 is a schematic diagram of another embodiment of a multi-channel ignition coil driver module in accordance with the present invention.

Referring now to FIG. 5, an alternate embodiment of a two-channel ignition coil driver module 300 is shown. Module 300, like module 200, includes a control integrated circuit 312 and a pair of high current load drive integrated circuits 214 and 215 mounted within a housing 316. High current load drive integrated circuits 214 and 215 are identical in structure and function to the correspondingly numbered integrated circuits of FIG. 4 and will therefore not be discussed further, with the exception that each integrated circuits 214 and 215 are mounted to terminals LOAD1 322 and LOAD2 324 respectively, which include tab-like projections that act as module attachment locations, heat sinks and electrical connection terminals as previously discussed with respect to tab-like projections 219' and 220' of FIG. 4.

Control integrated circuit 312 is shown in FIG. 5 as having an alternate embodiment as compared to control circuit 212 discussed earlier. Essentially, control integrated circuit 312 includes the same functions as control integrated circuit 212 except each of the input signals Input1 and Input2 are differential signals. Thus, Input1 requires a pair of terminals 318 and 319 extending from housing 316 for receiving a differential Input1 control signal from an external source (not shown). Similarly, Input2 requires a pair of terminals 320 and 321 extending into housing 316 for receiving a differential Input2 control signal from an external source (not shown). Since control signals Input1 and Input2 are differential signals, neither is sufficient to provide the earlier discussed dual function of providing both the input control signal and module power signal. As such, control integrated circuit 312 requires a B+ input thereto so that module 300 has a B+ terminal 322 extending therefrom. As with control integrated circuit 212, control integrated circuit 312 is preferably has a ground referenced substrate that is electrically connected to high current ground terminal 326 via attachment thereto. Alternatively (or redundantly), this electrical connection may be made via a bond wire 328.

Figure 6:
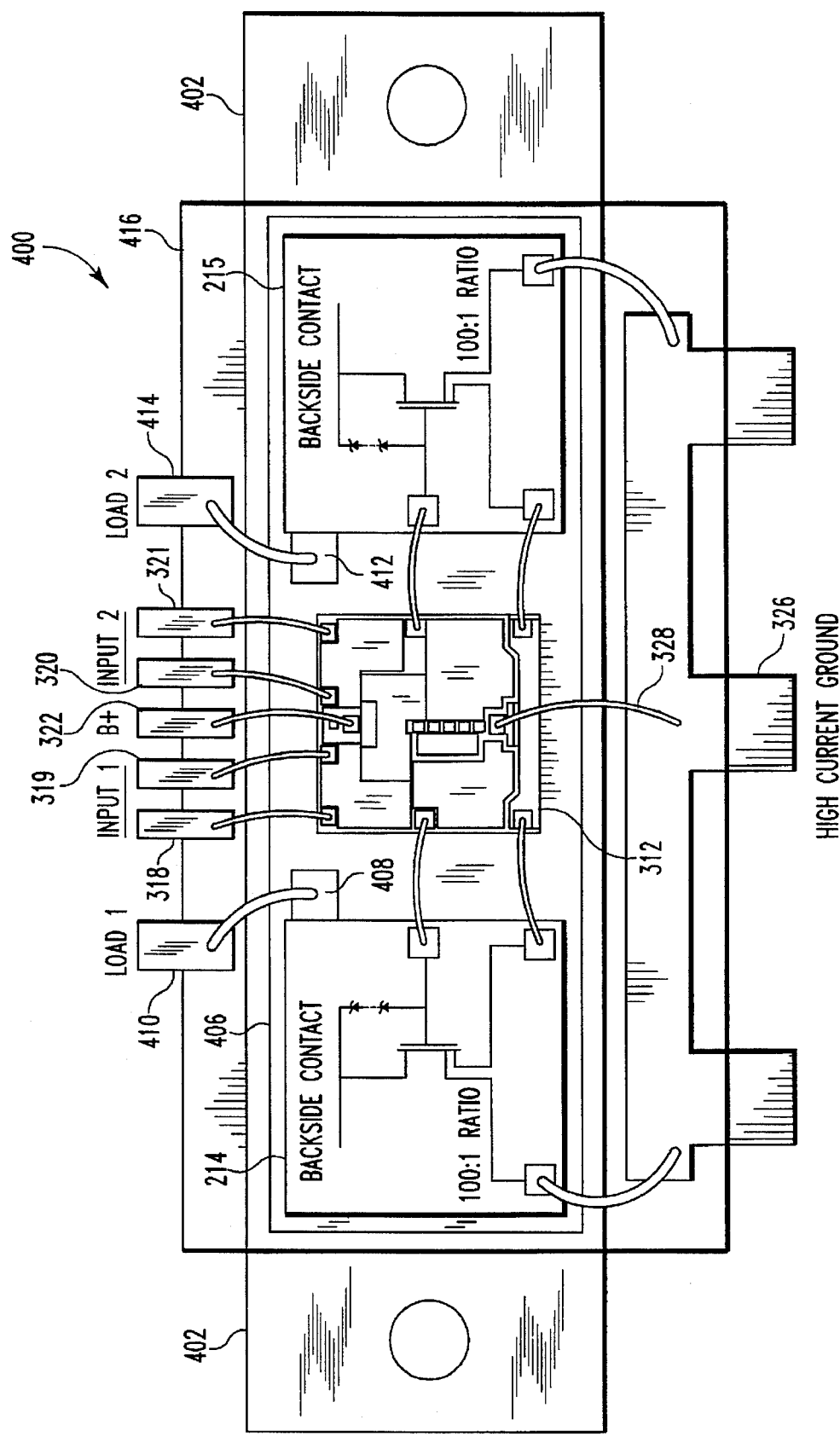
FIG. 6 is a schematic diagram of yet another embodiment of a multi-channel ignition coil driver module in accordance with the present invention.

Referring now to FIG. 6, another alternate embodiment of a two-channel ignition coil driver module 400 is shown. Module 400, like module 300, includes a control integrated circuit 312 and a pair of high current load drive integrated circuits 214 and 215 mounted within a housing 416. Control integrated circuit 312 and most connections thereto are identical to that shown and described with respect to FIG. 5. Similarly, high current load drive integrated circuits 214 and 215 are identical in structure and function to the correspondingly numbered integrated circuits of FIG. 4 and 5, and will therefore not be discussed further, with the exception that tab-like projections 322 and 324 discussed with respect to FIG. 5 have been merged into one tab-like projection 402 which functions, in this embodiment, as a heat sink only. Each integrated circuits 214 and 215, as well as control integrated circuit 312, are mounted to an electrically insulating substrate 406 via any known means, and substrate 406 is attached to tab-like projection 402 via any known means. As such, terminals LOAD1 410 and LOAD2 414 respectively extend into housing 416 and electrically attach, preferably via wire bond connections, to conductive pads 408 and 412 electrically connected to, and extending from, the substrates of integrated circuits 214 and 215 respectively. Finally, bond wire 328 as discussed with reference to FIG. 5 preferably provides an electrical ground connection between control integrated circuit 312 and high current ground terminal 326.

Although modules 200, 300 and 400 have been shown and described as three distinct embodiments, it is to be understood that each may further include any of the structures, functions and features described herein. For example, a variant of two-channel modules described herein may include single control signal input terminals IN1 and IN2, yet further rely on a B+ connection to power the control integrated circuit. Such variants among the structures and functions thus far described are intended to fall within the scope and spirit of the present invention.

Figure 7:
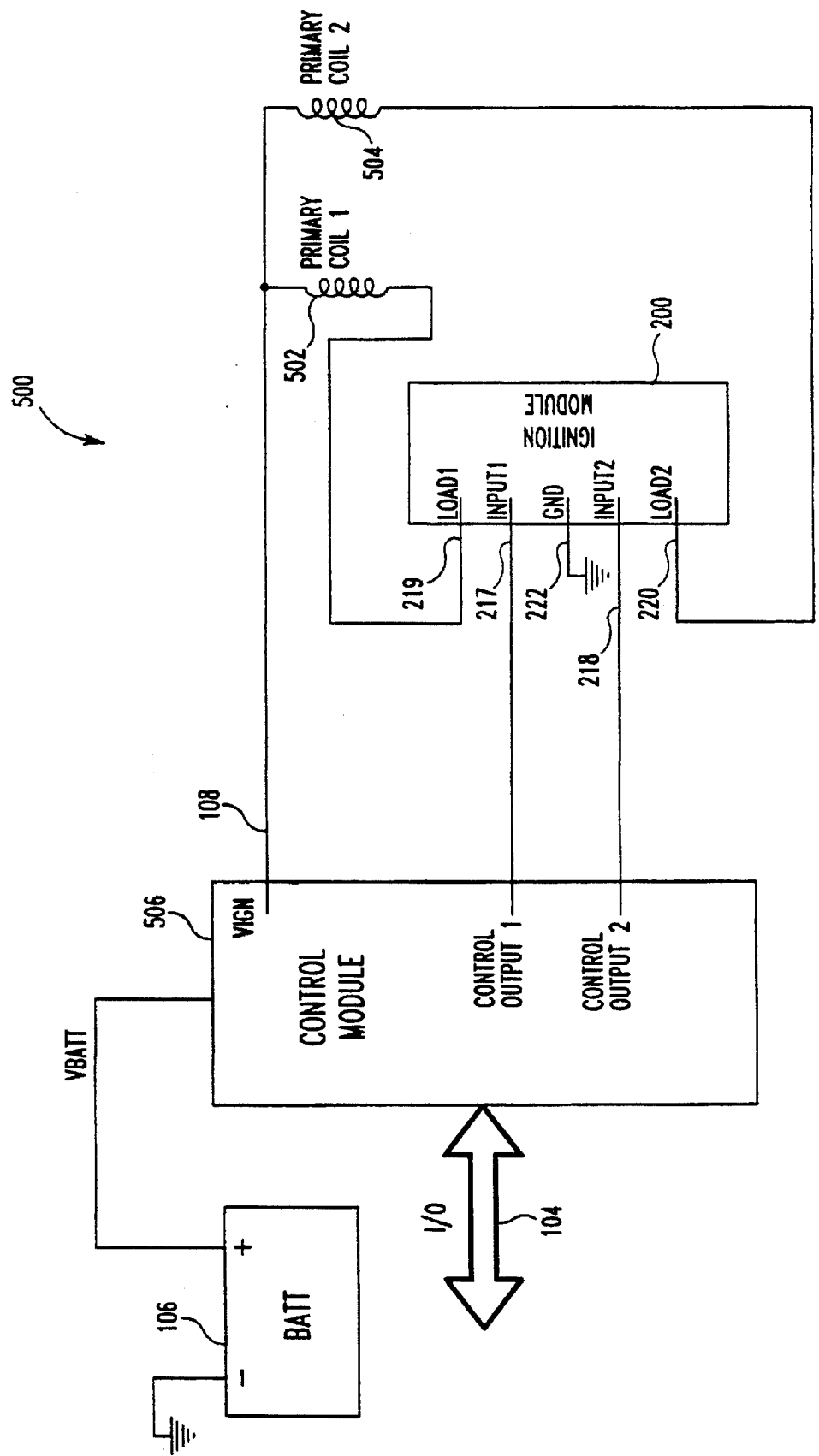
FIG. 7 is a schematic diagram showing a typical implementation of a multi-channel ignition control system incorporating the multi-channel ignition coil driver module embodiment of FIG. 4.

Referring now to FIG. 7, an ignition coil control system 500 for driving multiple ignition coils is shown. System 500 is shown having twos channel ignition coil driver module 200 incorporated therein to drive primary coils 502 and 504 respectively, although it is to be understood that system 500 may be easily modified to drive any number of multiple injector coils with an appropriately configured injector coil driver module. System 500 is identical in many respects, and similar in other respects, to the single channel ignition coil control system 100 shown and described with respect to FIG. 2. Like numbers are therefore used to identify like elements. Control module 506 is identical in most respects to control module 102 of FIG. 2 with the exception that control module 506 provides multiple control signals to a correspondingly multi-channel ignition coil as driver module. As shown in FIG. 7, control module 506 provides two such control signals Control Output1 and Control Output2.

Multi-channel ignition coil driver module 200 receives Control Output1 at INPUT1 217, and Control Output2 at INPUT2 218. GND 222 is ground referenced, LOAD1 is connected to one end of primary coil1 502 and LOAD2 is connected to one end of primary coil2 504. The opposite ends of each of the primary coils 502 and 504 are connected to VIGN 108 which is connected through switch 110 (not shown in FIG. 7) to $V_{BATT}$.

In operation, ignition coil control system 500 provides a control signal at either Control Output1 or Control Output2 to correspondingly activate primary coil1 502 or primary coil2 504. Multi-channel ignition control module 200 is operable to receive either, or both, of the Control Output signals to thereby independently of the other, simultaneously activate (provide electrical power to) the various circuits within control integrated circuit 212 and to energize either primary coil1 502 or primary coil2 504, or both, each in a manner identical to that discussed with is respect to FIGS. 1-3. It should be pointed out that the current limit circuit 254 must be provided as two separate error amplifiers, each having resistor $R_T$ in common, if current limit circuit 254 is to be implemented with a preferred error amplifier configuration as described in related U.S. patent application having an Ser. No. 08/508,402, entitled IGNITION COIL DRIVER MODULE INCLUDING COIL CURRENT LIMITING FEATURE, filed by John R. Shreve et al., and assigned to the assignee of the present invention. Those skilled in the art will recognize that two such amplifiers, each having their own feedback and input resistors, are required for simultaneous operation of the two channels. However, it is to be understood that alternate current limit circuit 254 embodiments are contemplated by the present invention so that either independent or simultaneous operations of the two channels may be carried out with a single current limit circuit 254 as shown in FIG. 7. Those skilled in the art of ignition coil control systems will further recognize that only minor modifications need be made to system 500 in order to implement either multi-channel ignition module embodiment 300 or 400.

While the invention has been illustrated and described in detail in the foregoing drawings and description, the same is to be considered as illustrative and not restrictive in character, it being understood that only the preferred embodiment has been shown and described and that all changes and modifications that come within the spirit of the invention are desired to be protected. For example, although the ignition coil driver modules 10, 200, 300 and 400 are shown and described as driving a primary coil of an ignition coil, it is to be understood that the present invention contemplates alternate embodiments wherein the multiple integrated circuit concept of the present invention may be implemented in a control system required to drive any high current inductive, resistive or capacitive load, or any combination thereof. As a second example, although the ignition coil driver modules 10, 200, 300 and 400 are further shown and described as being implemented in a so-called low side driver configuration, it is to be understood that modules 10, 200, 300 and 400 can also be made to operate in high-side driver configurations, i.e. with the IGBT connected directly to VIGN 108, and the load (primary coil) being connected between the IGBT and ground potential. Those skilled in the art will recognize that only minor modifications to control integrated circuit need be made in order to effectuate such an arrangement such as, for example, the addition thereto of voltage doubling circuitry for driving the gate of one of the IGBTs.

The embodiments of the invention in which an exclusive property or privilege is claimed are defined as follows:

1. A module for driving multiple high current loads comprising:
    a control circuit responsive to a plurality of low voltage control signals to provide a corresponding plurality of low voltage drive signals, said control circuit being formed of a low voltage semiconductor material arranged as an integrated circuit;
    a plurality of high current load driver circuits each arranged as an independent integrated circuit formed of a high voltage semiconductor material, each of said high current load driver circuits being responsive to a different one of said plurality of low voltage drive signals to energize a corresponding one of the multiple high current loads; and
    a housing having said control integrated circuit and said plurality of high current load driver integrated circuits mounted therein.

2. The module of claim 1 further including a multiplicity of electrical conductors extending into said housing, each of said multiplicity of electrical conductors forming an electrical connection with one of said integrated circuits mounted therein.

3. The module of claim 2 wherein said multiplicity of electrical conductors includes a plurality of input terminals electrically connected to said control circuit, each of said input terminals receiving a different one of said low voltage control signals thereat.

4. The module of claim 3 wherein said multiplicity of electrical conductors includes a voltage supply terminal electrically connected to said control circuit, said voltage supply terminal receiving a supply voltage thereat and providing said supply voltage to said control circuit.

5. The module of claim 4 wherein each of said low voltage control signals includes a pair of a differential signals;
    and wherein each of said plurality of input terminals includes a pair of differential input terminals.

6. The module of claim 3 wherein said multiplicity of electrical conductors includes a plurality of output terminals each electrically connected to a different one of said plurality of high current load driver circuits, each of said output terminals being further connectable to one of the multiple high current loads to thereby provide a load current path from each of the high current loads through a corresponding one of said high current load driver circuits.

7. The module of claim 6 wherein said multiplicity of electrical conductors includes a ground terminal electrically connected to each of said integrated circuits, said ground terminal being connectable to a ground reference for providing a ground potential reference to said module.

8. The module of claim 6 wherein each of said plurality of said high current load driver integrated circuits includes a substrate, and wherein each of said plurality of output terminals are electrically connected to a different one of said high current load driver integrated circuit substrates.

9. The module of claim 8 wherein each of said plurality of output terminals forms an integrated circuit mount within the module, each of said plurality of output terminals being electrically connected to a substrate of a corresponding high current load driver integrated circuit via attachment of said high current driver integrated circuit to said mount.

10. The module of claim 9 wherein each of said plurality of high current load driver integrated circuit substrates is attached to a corresponding one of said mounts by solder attachment, and wherein each of said mounts further act as a heat sink to thereby dissipate heat generated by said plurality of high current load driver circuits.

11. The module of claim 9 wherein said ground terminal forms an integrated circuit mount;

and wherein said control integrated circuit includes a substrate;

and wherein said control integrated circuit substrate is attached to said ground terminal integrated circuit mount to form said electrical connection therebetween.

12. The module of claim 11 wherein said control circuit is attached to said ground terminal integrated circuit mount via one of conductive epoxy and solder.

13. The module of claim 7 further including a substrate, said control integrated circuit and each of said plurality of high current load driver integrated circuits being mounted to said substrate.

14. The module of claim 13 further including a heat sink, said substrate being mounted to said heat sink to thereby direct heat generated by said plurality of high current load driver integrated circuits toward said heat sink.

15. The module of claim 14 wherein said substrate is formed of ceramic.

16. The module of claim 1 wherein each of said high current load driver circuits includes a power transistor, each of said power transistors having a first input for receiving one of said low voltage drive signals, a second input for receiving a load current from a corresponding one of the multiple high current loads, and an output, each of said power transistors conducting said load current from said second input to said output in response to a corresponding one of said low voltage drive signals.

17. The module of claim 16 wherein at least one of said power transistors is an insulated gate bipolar transistor.

18. The module of claim 1 wherein at least one of the multiple high current loads is an inductive load.

19. The module of claim 18 wherein said at least one inductive load is a primary coil of an internal combustion engine ignition coil.

20. The module of claim 1 wherein each of said high current load driver circuits is operable to drive a high current load having a load current associated therewith within a range of between approximately 500 milliamperes to approximately 20 amperes.

21. A module for driving multiple high current loads comprising:

a low voltage control integrated circuit responsive to any of a plurality of low voltage control signals to simultaneously provide electrical power thereto and produce a corresponding plurality of low voltage drive signals;

a plurality of high current driver integrated circuits each responsive to a different one of said plurality of low voltage drive signals to energize a corresponding one of the multiple high current loads; and a housing having said low voltage control integrated circuit and said plurality of high current driver integrated circuits mounted therein.

22. The module of claim 21 wherein said low voltage drive signal provided by said control integrated circuit has a maximum voltage of approximately 7.0 volts.

23. The module of claim 22 wherein said high current driver integrated circuit is operable to drive a high current load having a load current associated therewith within a range of between approximately 500 milliamperes and approximately 20 amperes.

24. The module of claim 23 wherein each of said plurality of high current load driver integrated circuits includes a power transistor having an input terminal connected to one of said plurality of low voltage drive signals of said control integrated circuit, each of said low voltage drive signals providing a low level drive current to a corresponding one of said input terminals to thereby turn on the power transistor to full conduction.

25. The module of claim 24 wherein said low level of input current is within a range of between approximately 200 micro amperes to approximately 3.0 milliamperes.

26. The module of claim 25 wherein at least one of said power transistors is an insulated gate bipolar transistor.

27. The module of claim 21 wherein at least one of said high current loads is an inductive load.

28. The high current load drive circuit of claim 27 wherein said at least one inductive load is a primary coil of an internal combustion engine ignition coil.

29. The module of claim 21 further including a plurality of electrical conductors extending into said housing and forming an electrical connection with said low voltage control integrated circuit and said plurality of high current load driver integrated circuits.

30. An ignition control system comprising:

a control module providing a plurality of ignition coil control signals;

a corresponding plurality of ignition coils each having a primary ignition coil connected at a first end to a source of electrical power; and an ignition coil driver module having a corresponding plurality of inputs and outputs, each of said inputs receiving a different one of said plurality of ignition coil control signals, each of said outputs being connected to a second end of a different one of said plurality of primary ignition coils, said ignition coil driver module being independently responsive to any of said ignition coil control signals to simultaneously provide electrical power to said ignition coil driver module and energize a corresponding one of said primary coils.

31. The ignition coil control system of claim 30 wherein said ignition coil driver module includes:

a control integrated circuit responsive to said plurality of ignition coil control signals to provide a corresponding plurality of ignition coil drive signals;

a corresponding plurality of ignition coil driver integrated circuits each responsive to a different one of said plurality of ignition coil drive signals to energize a corresponding one of said primary ignition coils by providing a coil current conduction path from said source of electrical power through said primary ignition coil and through said ignition coil driver integrated circuit; and a housing having said control integrated circuit and said plurality of ignition coil driver integrated circuits mounted therein.

32. The ignition coil control system of claim 31 wherein said plurality of ignition coil control signals and said plurality of ignition coil drive signals are low voltage signals; and wherein said control integrated circuit is formed of a low voltage semiconductor material.

33. The ignition coil control system of claim 32 wherein each of said ignition coil driver integrated circuits is formed of a high voltage semiconductor material.

* * * * *